United States Patent [19]
Davidson

[11] Patent Number: 6,140,141
[45] Date of Patent: Oct. 31, 2000

[54] METHOD FOR COOLING BACKSIDE OPTICALLY PROBED INTEGRATED CIRCUITS

[75] Inventor: Howard L. Davidson, San Carlos, Calif.

[73] Assignee: Sun Microsystems, Inc., Palo Alto, Calif.

[21] Appl. No.: 09/221,284

[22] Filed: Dec. 23, 1998

[51] Int. Cl.$^7$ ..................................................... H01L 21/66
[52] U.S. Cl. .............................................. 438/16; 438/116
[58] Field of Search ............................. 438/16, 108, 116; 374/5; 356/51; 148/DIG. 162

[56] References Cited

U.S. PATENT DOCUMENTS

| | | |
|---|---|---|
| 4,957,882 | 9/1990 | Shinomiya . |
| 5,396,068 | 3/1995 | Bethea . |
| 5,863,810 | 1/1999 | Kaldenberg . |
| 5,895,972 | 4/1999 | Paniccia ................................... 257/706 |

FOREIGN PATENT DOCUMENTS 0493208  1/1992  European Pat. Off. .

OTHER PUBLICATIONS

Anonymous: "Backside Silicon Integrated Circuit Infrared Immersion Lens/Heat–Sink", IBM Technical Dislosure Bulletin., vol. 35, No. 7, Dec. 1992, IBM Corp., New York, pp. 489–492.

*Primary Examiner*—George Fourson
*Attorney, Agent, or Firm*—Steven F. Caserza; Flehr Hohbach Test Albritton & Herbert LLP

[57] ABSTRACT

A method and apparatus for cooling an integrated circuit device mounted face-down on a package such that the device may be optically probed. The method of the present invention includes the following steps: (1) placing an optically-transparent window over the integrated circuit device to form a channel bounded by the optically-transparent window and the integrated circuit device and (2) flowing an optically-transparent fluid through the channel to remove heat dissipated by the integrated circuit device. The apparatus of the present invention includes: (1) an inlet for receiving an optically-transparent fluid, (2) an optically-transparent window for placement over the integrated circuit device, (3) a channel bounded by the optically-transparent window and the integrated circuit device and coupled to the inlet for directing the optically-transparent fluid to flow over the integrated circuit device to remove heat dissipated by the integrated circuit device and (4) an outlet coupled to the channel for discharging the optically-transparent fluid from the channel.

9 Claims, 2 Drawing Sheets

METHOD FOR COOLING BACKSIDE OPTICALLY PROBED INTEGRATED CIRCUITS

BRIEF DESCRIPTION OF THE INVENTION

The present invention relates generally to methods for cooling integrated circuits. More particularly, the present invention relates to a method and apparatus for cooling a "flip-chip" integrated circuit such that it may be optically probed through its backside.

BACKGROUND OF THE INVENTION

Increasingly, integrated circuit devices are mounted to their packages face-down, i.e., the surface of the device containing the electronic circuitry faces towards the package. Integrated circuits mounted in this manner are commonly referred to as "flip-chip" devices.

The circuitry of a flip-chip device mounted on a package cannot be probed using conventional electronic probing techniques because the circuitry is physically inaccessible to the probe. Instead, the circuitry of the flip-chip device is typically probed through its backside using an optical probe. An optical probe determines the voltage of a circuit node by sensing infrared radiation through the substrate of the device (i.e., silicon is transparent to near-infrared light). Two types of optical probes are used in the art: (1) reflective optical probes and (2) emission optical probes. A reflective optical probe directs an infrared light beam emitted by a laser onto a surface of the device and measures the polarization of the light reflected from the device. The change in polarization of the light is used to determine the voltage in the circuit. An emission optical probe determines the circuit voltage by measuring the intensity of the infrared light emitted by the circuit.

To optically probe a flip-chip integrated circuit device, optical access must be provided to the backside of the device. At the same time, modern high-speed devices typically require a heat sink or some other heat dissipating mechanism to dissipate the large amounts of heat generated by the device. Unfortunately, placing a heat sink on the device would prevent optical probing.

In view of the foregoing, it would be highly desirable to cool a flip-chip integrated circuit such that it may be optically probed through its backside.

SUMMARY OF THE INVENTION

The present invention is a method and apparatus for cooling an integrated circuit device mounted face-down on a package such that the device may be optically probed. The method of the present invention includes the following steps: (1) placing an optically-transparent window over the integrated circuit device to form a channel bounded by the optically-transparent window and the integrated circuit device and (2) flowing an optically-transparent fluid through the channel to remove heat dissipated by the integrated circuit device. The apparatus of the present invention includes: (1) an inlet for receiving an optically-transparent fluid, (2) an optically-transparent window for placement over the integrated circuit device, (3) a channel bounded by the optically-transparent window and the integrated circuit device and coupled to the inlet for directing the optically-transparent fluid to flow over the integrated circuit device to remove heat dissipated by the integrated circuit device and (4) an outlet coupled to the channel for discharging the optically-transparent fluid from the channel.

In one embodiment of the present invention, the optically-transparent fluid and the optically-transparent window are composed of materials substantially transparent to near-infrared radiation.

In another embodiment of the present invention, the optically-transparent fluid and the optically-transparent window are composed of materials substantially without optical rotary power.

In yet another embodiment of the present invention, a dimension of the channel between the optically-transparent window and the integrated circuit device is less than a boundary layer thickness of the optically-transparent fluid.

The present invention thus allows an integrated circuit device to be cooled while being optically probed.

BRIEF DESCRIPTION OF THE DRAWINGS

For a better understanding of the nature and objects of the invention, reference should be made to the following detailed description taken in conjunction with the accompanying drawings, in which.

Like reference numerals refer to corresponding parts throughout the several views of the drawings.

DETAILED DESCRIPTION OF THE INVENTION

Figure 1:
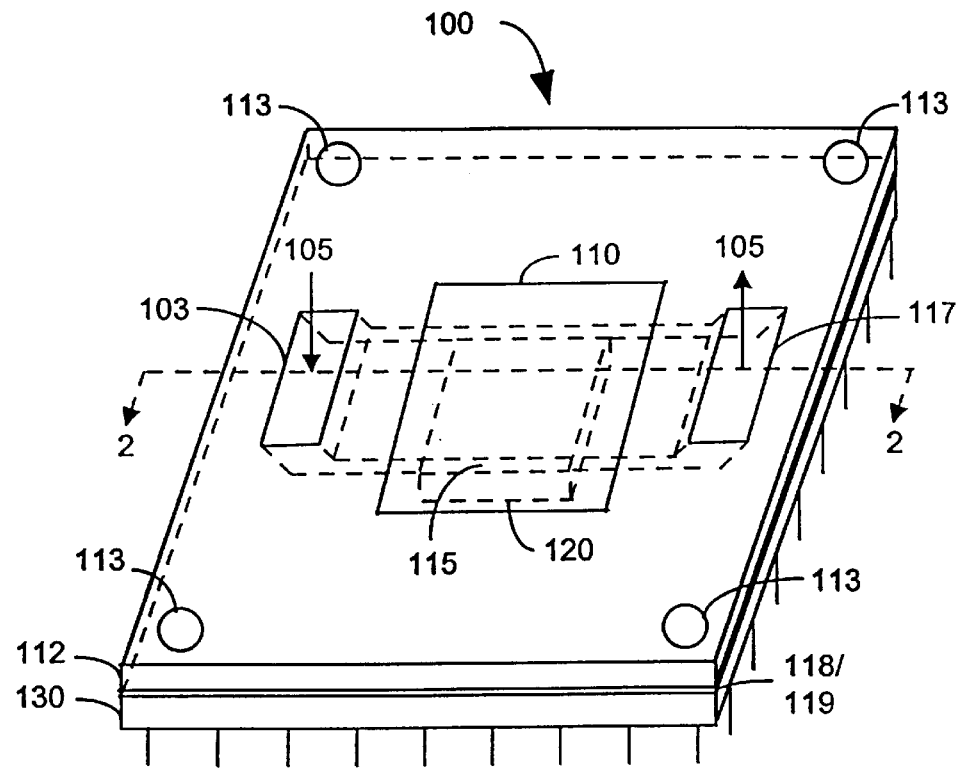
FIG. 1 is a perspective view of a cooling apparatus in accordance with an embodiment of the present invention mounted on a package.
Figure 2:
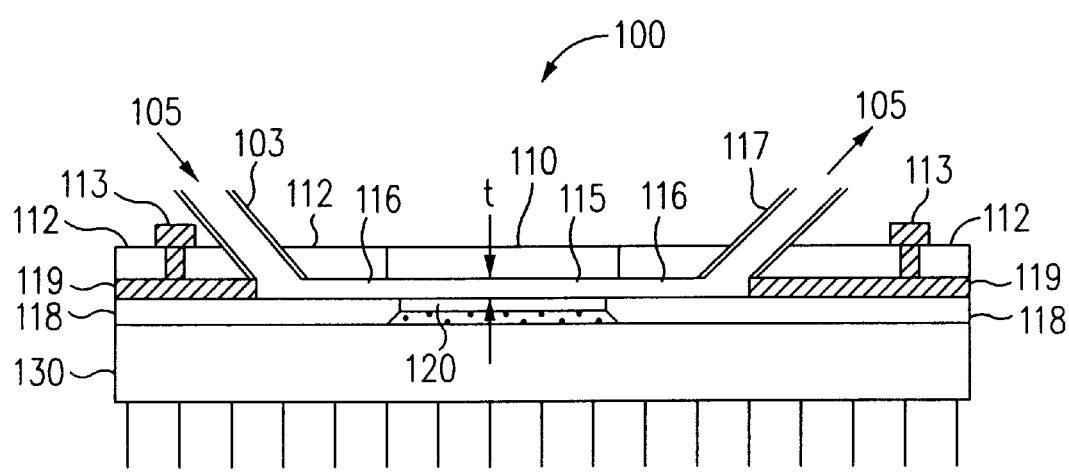
FIG. 2 is a cross-sectional view of the cooling apparatus shown in FIG. 1 along the line 2—2.

FIGS. 1 and 2 show a cooling apparatus 100 in accordance with an embodiment of the present invention. The cooling apparatus 100 is used to cool an integrated circuit device or die 120 mounted face-down on a package 130 such that the die may be optically probed through its backside (i.e., the surface of the die facing away from the package). As mentioned in greater detail below, the cooling apparatus 100 cools the die 120 by directing an optically-transparent fluid 105 to flow over the backside of the die.

The cooling apparatus 100 includes an inlet 103 for receiving the optically-transparent fluid 105. The inlet 103 is preferably positioned at an angle relative to the surface of the die, as shown in FIG. 2, to minimize turbulence in the fluid 105. Alternatively, the inlet 103 may be positioned horizontally (which also minimizes turbulence) or vertically.

The cooling apparatus 100 also includes an optically-transparent window 110 for positioning over the die 120. The window 110 forms a channel 115 that directs the fluid 105 across the backside of the die 120, as described farther below. The window 110 is placed substantially parallel to the backside of the die to ensure that the radiation transmitted to the optical probe is not distorted by the window or the fluid and also to provide a laminar fluid flow. In one embodiment of the present invention, the window 110 is parallel to the backside of the die 120 to within about 0.02 mm to about 0.05 mm.

The fluid 105 and window 110 are optically transparent so that radiation emitted by circuitry on the die 120 through its backside may be sensed by an optical probe without substantial attenuation or distortion. To minimize the attenuation, the fluid 105 and window 110 may be made of materials substantially transparent to near-infrared radiation (i.e., radiation having wavelengths about 1 $\mu$m or more). Furthermore, when the cooling apparatus 100 is used with a reflective optical probe, the fluid and window should be made of materials substantially without optical rotary power to minimize the distortion in the reflected light measured by the probe. For example, the fluid 105 may be deionized water or an organic fluid such as the FC-Series perflurocarbon fluid by Minnesota Manufacturing and Mining Corp.

(Minneapolis, Minn.). The window 110 may be made of fused quartz or BK-7 glass.

The cooling apparatus 100 additionally includes a channel 115 bounded by the window 10 and the die 120. The channel 115 directs the fluid 105 in a laminar flow across the backside of the die 120 so as to remove heat dissipated by the die. Preferably, the channel 115 has a thickness t that is less than, and more preferably, much less than a boundary layer thickness of the fluid 105 to minimize the thermal resistance of the fluid 105 flowing through the channel. The boundary layer thickness of a fluid depends on several characteristics of the fluid, as is known in the art. In one embodiment of the present invention, the thickness t is between about 0.2 mm and about 0.5 mm.

The cooling apparatus 100 further includes an outlet 117 coupled to the channel 115 for discharging the fluid 105 from the channel. The outlet 117 is preferably positioned at an angle relative to the surface of the die, as shown in FIG. 2, to minimize turbulence in the fluid 105. Alternatively, the outlet 105 may be positioned horizontally (which also minimizes turbulence) or vertically.

Lastly, the cooling apparatus 100 includes a body 112 that encloses and supports the window 110. The body 112 may include a plurality of set screws 113 to adjust the alignment and spacing of the window 110 relative to the backside of the die 120. The body 112 also defines a cavity 116 shaped to direct the fluid 105 from the inlet 103 to the channel 115 and from the channel to the outlet 117 in a laminar flow.

In one embodiment of the present invention, the cooling apparatus 100 further includes a shim 118 disposed between the body 112 and the package 130 to provide support for the body. A gasket 119 may be placed between the body 112 and the shim 118 to form a watertight seal therebetween. The gasket 119 may be composed of a soft material such as silicone rubber or of an adhesive preform. A watertight seal may also be formed by applying an adhesive, water-resistant material such as epoxy between the body 112 and the shim 118. In this embodiment, the cooling apparatus 100 is permanently bonded to the package 130.

Figure 3:
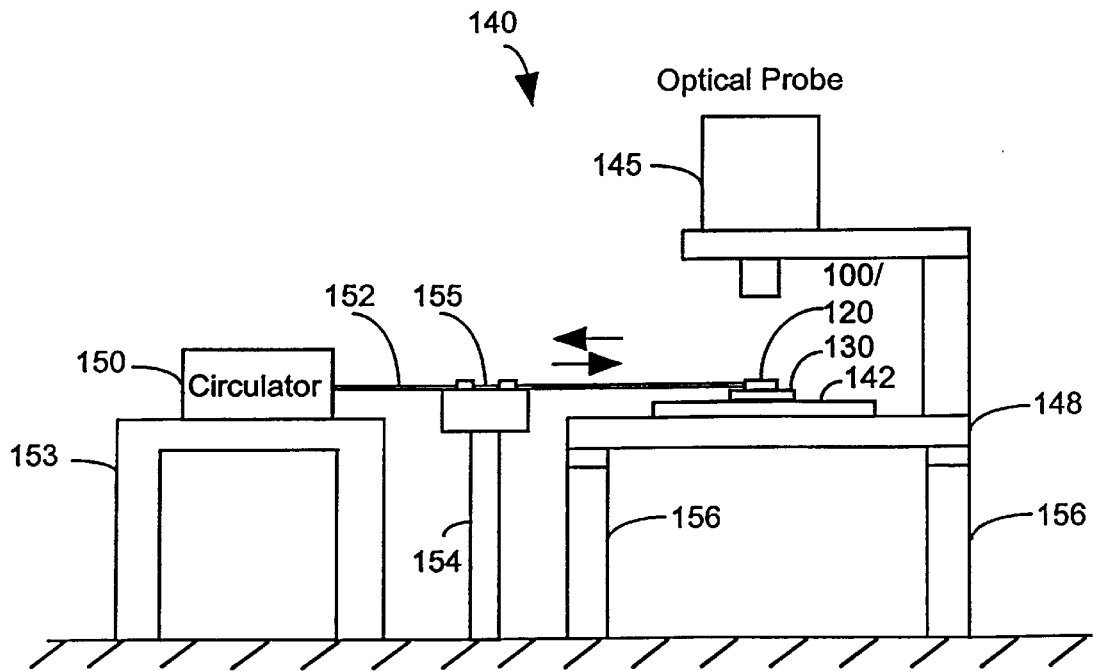
FIG. 3 is a diagrammatic view of a testing system employing the cooling apparatus of FIG. 1.

FIG. 3 shows a testing system 140 used to optically probe the die 120 while it is being cooled by the cooling apparatus 100. The testing system 140 includes an optical probe 145 for sensing the voltages of signals on the die 120. The testing system 140 also includes a system board 142 on which the die is mounted for sending and receiving signals from the die during the testing process. The testing system 140 further includes a chilled circulator 150 for cooling and delivering the fluid 105 to the cooling apparatus 100 mounted over the die 120. A plurality of flexible hoses 152 are used to transport the fluid 105 between the circulator 150 and the cooling apparatus 100.

Preferably, the optical probe 145 and the circulator 150 are placed on separate supports to prevent vibrations generated by the circulator from being transmitted to the optical probe. The optical probe 145 and the system board 142 are supported by a first support 148. The first support 148 includes multiple air isolation legs 156 that are equipped with pneumatic springs to prevent vibrations produced by the circulator 150 and other sources from being transmitted to the optical probe 145 or the die 120. The circulator 150 is supported by a second support 153. Optionally, the hoses 152 may be clamped to a third support 154 that includes a block 155 made of a dense, heavy metal for absorbing vibrations transmitted through the hoses from the circulator. For improved vibration absorbing characteristics, the block 155 may be composed of a sandwich of alternating metal layers and damping layers made of a viscoelastic material.

The foregoing description, for purposes of explanation, used specific nomenclature to provide a thorough understanding of the invention. However, it will be apparent to one skilled in the art that the specific details are not required in order to practice the invention. Thus, the foregoing descriptions of specific embodiments of the invention are presented for purposes of illustration and description. They are not intended to be exhaustive or to limit the invention to the precise forms disclosed; obviously many modifications and variations are possible in view of the above teachings. The embodiments were chosen and described in order to best explain the principles of the invention and its practical applications, to thereby enable others skilled in the art to best utilize the invention and various embodiments with various modifications as are suited to the particular use contemplated. It is intended that the scope of the invention be defined by the following claims and their equivalents.

What is claimed is:

1. A method for cooling an integrated circuit device mounted face-down on a package such that the device may be optically probed, comprising the steps of:

placing an optically-transparent window over said integrated circuit device to form a channel bounded by said optically-transparent window and said integrated circuit device; and flowing an optically-transparent fluid through said channel to remove heat dissipated by said integrated circuit device.

2. The method of claim 1, wherein said placing step includes forming said channel with a dimension between said optically-transparent window and said integrated circuit device that is less than a boundary layer thickness of said optically-transparent fluid.

3. The method of claim 2, wherein said dimension of said placing step is between about 0.2 mm and about 0.5 mm.

4. The method of claim 1, wherein said placing step includes placing said optically-transparent window over said integrated circuit device such that said optically-transparent window is parallel to a surface of said integrated circuit device to within about 0.02 to about 0.05 mm.

5. The method of claim 1, wherein:

said placing step comprises placing an optically-transparent window substantially transparent to near-infrared radiation over said integrated circuit device; and said flowing step comprises flowing an optically-transparent fluid substantially transparent to near-infrared radiation through said channel.

6. The method of claim 1, wherein:

said placing step comprises placing an optically-transparent window substantially without optical rotary power over said integrated circuit device; and said flowing step comprises flowing an optically-transparent fluid substantially without optical rotary power through said channel.

7. The method of claim 1, wherein said placing step comprises placing an optically-transparent window made of fused quartz over said integrated circuit device.

8. The method of claim 1, wherein said flowing step comprises flowing deionized water through said channel.

9. The method of claim 1, wherein said flowing step comprises flowing said optically-transparent fluid in a substantially laminar flow through said channel.

* * * * *